United States Patent [19]

Matsuoka

[11] Patent Number: 5,204,618
[45] Date of Patent: Apr. 20, 1993

[54] MONITORED BURN-IN SYSTEM

[75] Inventor: Eiki Matsuoka, Tokyo, Japan

[73] Assignee: NEC Corporation, Tokyo, Japan

[21] Appl. No.: 836,512

[22] Filed: Feb. 18, 1992

[30] Foreign Application Priority Data

Feb. 18, 1991 [JP] Japan ............................. 3-022526

[51] Int. Cl.⁵ ..................... G01R 31/28; G01R 31/02
[52] U.S. Cl. .......................... 324/158 R; 324/158 F; 371/22.1
[58] Field of Search ............... 324/158 F, 158 R, 501, 324/537, 73.1; 371/16.1, 22.1; 219/209

[56] References Cited

U.S. PATENT DOCUMENTS 4,145,620  3/1979  Dice ..................................... 324/501
4,683,424  7/1987  Cutright et al. ................. 324/158 F
4,866,714  9/1989  Adams et al. ...................... 371/22.1

Primary Examiner—Ernest F. Karlsen
Attorney, Agent, or Firm—Sughrue, Mion, Zinn, Macpeak & Seas

[57] ABSTRACT

The invention relates to a monitored burn-in system for operating a group of semiconductor devices such as ICs under an accelerated aging condition. To automatically and appropriately determine the burn-in duration, the disclosed system includes a counting means to count a cumulative number of failed devices at predetermined time intervals, a computing means to compute a cumulative failure rate of the devices at the same time intervals and further compute an increment of the cumulative failure rate during each of the time intervals, and a comparison and control means to compare the computed increment of the cumulative failure rate with a predetermined reference increment of cumulative failure rate and produce a command signal to terminate the burn-in procedure when the computed increment is not greater than the reference increment.

4 Claims, 2 Drawing Sheets

MONITORED BURN-IN SYSTEM

BACKGROUND OF THE INVENTION

This invention relates to a burn-in system for screening semiconductor devices such as ICs (integrated circuits) by operating the devices under accelerated aging conditions for some period of time while monitoring the behavior of each device.

In the inspection of industrially manufactured ICs a burn-in procedure is widely employed as a screening test to eliminate early failures from the devices supplied to customers. Burn-in is performed after completion of the IC fabrication process, that is, after resin encapsulation of individual IC chips mounted on leadframes. In a dynamic burn-in procedure the ICs to be screened are kept at a predetermined high temperature for a prescribed period of time to accelerate aging, and an operational current and driving signals are applied to the ICs under the specified accelerated aging conditions.

For burn-in testing of ICs a recent trend is to employ a monitored burn-in system which includes monitoring instruments for examining whether or not the operational current and driving signals are being properly applied to each of ICs under accelerated aging and whether or not each IC is operating properly. The employment of monitored burn-in systems will enhance the reliability of burn-in procedures.

For a burn-in procedure it is important to appropriately set the duration of burn-in. In the practice of burn-in of ICs with a conventional burn-in system which may or may not be monitored, the burn-in duration is set based on the results of preliminary testing on the same type of ICs. The preliminary testing is for the purpose of examining a correlation between accelarated aging time and a cumulative failure rate of the ICs under accerated aging to determine the time by which the cumulative failure rate reaches saturation, and in compliance with the saturation time the duration of the actual burn-in procedure is set.

The correlation between accelerated aging time and the cumulative failure rate is specific to each type of IC. Therefore, to perform burn-in test of various types of ICs it is necessary to collect failure rate data for setting an appropriate burn-in duration for each type of IC. The data collecting work requires much time and labor. Furthermore, for any type of IC the burn-in duration determined by this method is not always appropriate since there is a possibility that the quality level of the IC products varies by fluctuations of the manufacturing process conditions. If the duration of accelerated aging is inappropriate a burn-in procedure cannot be regarded as a really effective screening method for the guarantee of the reliability of IC products.

SUMMARY OF THE INVENTION

It is an object of the present invention to provide a monitored burn-in system which has the capability of automatically and appropriately setting the duration of burn-in irrespective of the type of ICs subjected to burn-in.

The present invention provides a monitored burn-in system for screening a group of semiconductor devices kept in a burn-in chamber under an accelerated aging condition, the system comprising power and signal supplying means for supplying power to the burn-in chamber to control the burn-in temperature in the chamber and applying operational current and driving input signals to the semiconductor devices in the chamber, monitoring means for monitoring the manner of operation of each of the devices in the chamber, counting means for counting a cumulative number of failed devices among the devices in the chamber at predetermined time intervals, computing means for computing a cumulative failure rate of the devices in the chamber at the predetermined time intervals each time based on the cumulative number counted by the counting means and producing a feedback signal representative of an increment of the cumulative failure rate during each of the predetermined time intervals, and control means for comparing the increment of the cumulative failure rate represented by the feedback signal with a predetermined reference increment of cumulative failure rate and commanding the power and signal supplying means to terminate the power and signal supplying operation to thereby automatically terminate the burn-in procedure when the increment of the cumulative failure rate represented by the feedback signal is not greater than the reference increment of the cumulative failure rate. An exemplary value of the reference increment is nearly 0 (zero), which means "almost saturated".

As will be understood from the above statement, a monitored burn-in system possesses the capability to automatically determine the duration of a burn-in procedure. With this burn-in system there is no need for preliminary testing to examine a correlation between accelerated aging time and cumulative failure rate. The automatic control of the burn-in duration is accomplished irrespective of the type of the devices subjected to burn-in, and in every case the burn-in duration is set very appropriately. That is, the automatically controlled burn-in duration is approximately in conformance with the length of accelerated aging time required for saturation of the cumulative failure rate of the devices under testing. Therefore, a burn-in procedure can be accomplished without leaving an intolerable possibility of early failures of the screened devices and without wasting time and energy for unnecessarily long aging.

A monitored burn-in system according to the invention is very suitable for burn-in test of ICs, but it is a matter of course that this system is useful also for burn-in test of semiconductor devices other than ICs.

DESCRIPTION OF THE PREFERRED EMBODIMENTS

Figure 1:
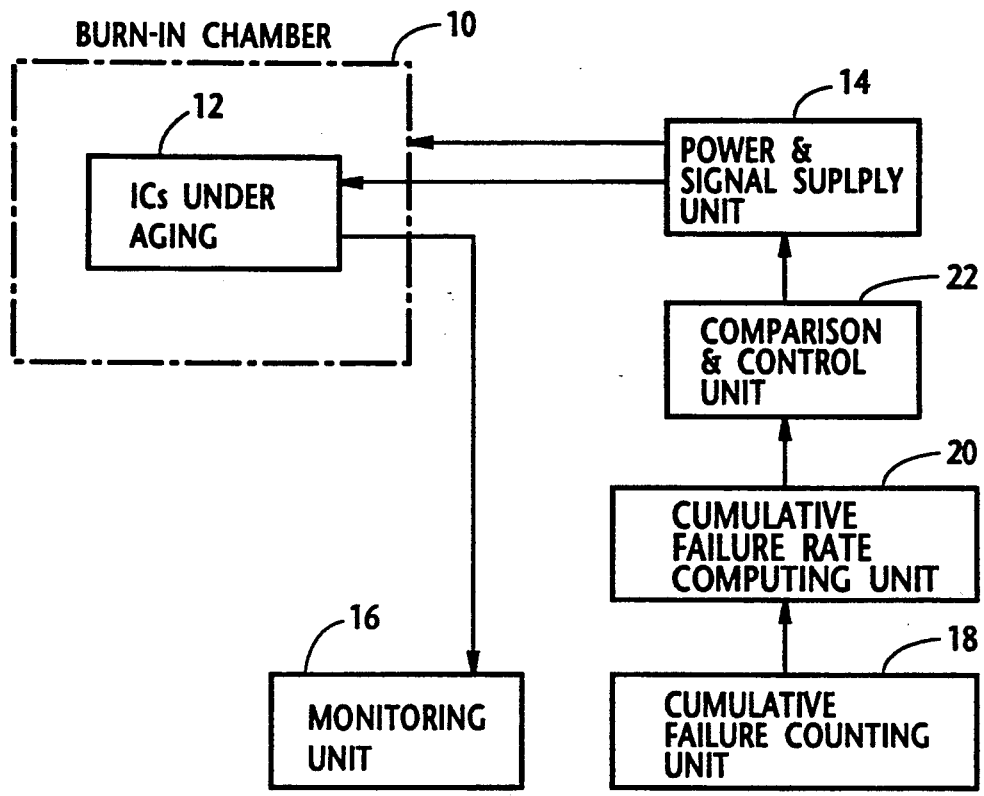
FIG. 1 is a block diagram of a monitored burn-in system according to the invention.

FIG. 1 shows the fundamental construction of a monitored burn-in system according to the invention. Numeral 10 indicates a burn-in chamber in which a group of ICs 12 are subjected to accelerated aging test under a controlled temperature condition. In principle the burn-in chamber 10 is a constant-temperature oven, and the ICs 12 are installed on testing boards (not shown) which are set on suitable racks (not shown).

The burn-in system has a power and signal supplying unit 14, which has the capability of supplying power to the oven 10 to control the temperature in the oven 10 and applying an operational electric current and driving input signals to the ICs 12 in the oven 10, and a monitoring unit 16 which includes a set of instruments to monitor the manner of operation of each of the ICs 12 in the oven 10. Besides the usual monitoring capabilities, the monitoring unit 16 has the capability of outputting an electrical signal each time when any one of the ICs 12 fails to function properly. Furthermore, this burn-in system includes a failure counting unit 18, a cumulative failure rate computing unit 20 and a comparison and control unit 22. The counting unit 18 receives the failure signals outputted from the monitoring unit 16, counts the cumulative number of failed ICs at predetermined time intervals and outputs an electrical singnal indicative of the result of counting. The computing unit 20 computes a cumulative failure rate of the ICs 12 each time when it receives a failure count signal from the failure counting unit 18, produces an electrical signal indicative of an increment of the cumulative failure rate during each of the aforementioned time intervals and supplies that signal to the comparison and control unit 22. The comparison and control unit 22 compares each increment signal supplied from the computing unit 20 with a predetermined reference increment of cumulative failure rate and outputs a command signal which commands the power and signal supplying unit 14 to terminate the burn-in procedure by stopping supplying power to the oven 10 and applying the operational current and driving signals to the ICs 12 if the increment of the actual cumulative failure rate is not greater than the reference increment. If the burn-in duration becomes the preset maximum time, the control unit 20 gives an alarm and stops the burn-in procedure.

A conventional monitored burn-in system has a counterpart of the above described power and signal supplying unit 14 and monitoring instruments analogous to the instruments in the above described monitoring unit 16, but it does not have counterparts of the counting unit 18, computing unit 20 and control unit 22.

Figure 3:
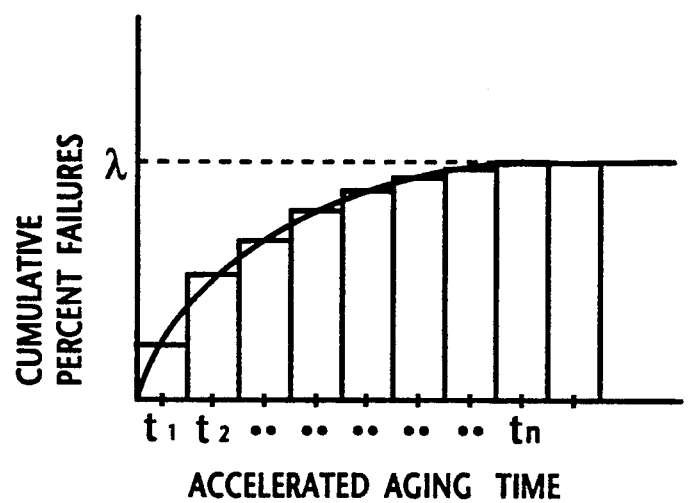
FIG. 3 is a chart for explanation of the operation of a conventional monitored burn-in system, the chart also showing the relationship between accelerated aging time and a cumulative failure rate of the devices under testing.

Referring to FIG. 3, in the case of performing burn-in of a group of ICs with a conventional burn-in system a preliminary test is conducted to calculate a cumulative failure rate at constant time intervals, viz. at times $t_1$, $t_2$, etc., to determine time $t_n$ at which the cumulative failure rate reaches saturation at a value $\lambda$, and the burn-in duration is set based on the length of time elapsed until $t_n$.

Figure 2:
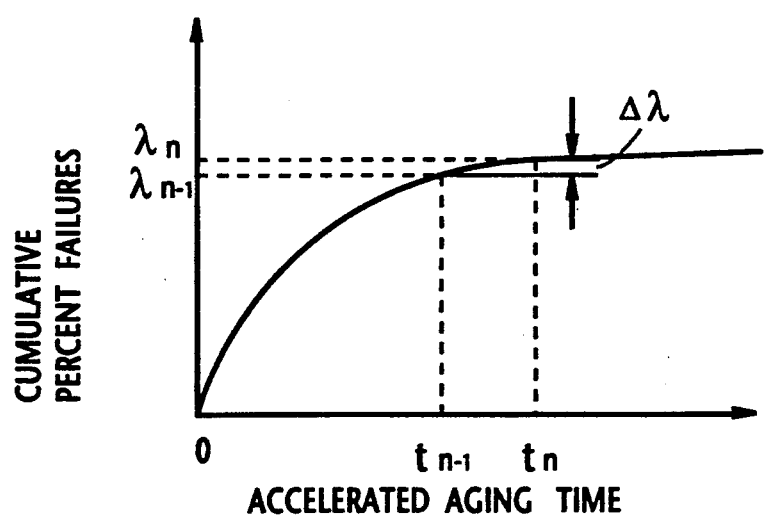
FIG. 2 is a chart for explanation of the operation of the burn-in system of FIG. 1, the chart showing the relationship between accelerated aging time and a cumulative failure rate of the devices under testing.

In the monitored burn-in system according to the invention shown in FIG. 1, the burn-in duration is automatically determined without need of any preliminary testing. As described above, using each of the IC failure signals supplied from the monitoring unit 16 the counting unit 18 counts a cumulative number of failed ICs at predetermined constant time intervals, and the computing unit 20 computes an increment of cumulative failure rate during in each of the time intervals. Referring to FIG. 2, the difference between time $t_n$ and time $t_{n-1}$ ($t_n - t_{n-1}$) is the length of the time interval. The cumulative failure rate is computed to be $\lambda_{n-1}$ at time $t_{n-1}$ and $\lambda_n$ at time $t_n$, so that the increment of the cumulative failure rate $\Delta\lambda$ during the time interval ($t_n - t_{n-1}$) is $\lambda_n - \lambda_{n-1}$. This increment $\Delta\lambda$ is inputted to the control unit 22 as a digital signal and compared with a predetermined reference increment of cumulative failure rate which takes a sufficiently small value. When $\Delta\lambda$ becomes equal to or smaller than the reference increment of cumulative failure rate, the control unit 22 provides the command signal described hereinbefore to the power and signal supplying unit 14 to terminate the burn-in procedure.

Thus, the monitored burn-in system according to the invention can screen the semiconductor devices by performing the test only for an optimum duration.

WHAT IS CLAIMED IS:

1. A monitored burn-in system for screening a group of semiconductor devices kept in a burn-in chamber, the system comprising:

power and signal supplying means for supplying power to said burn-in chamber to control the burn-in temperature in said chamber and supplying operational current and driving input signals to said semiconductor devices in said chamber;

monitoring means for monitoring the manner of operation of each of said devices in said chamber;

counting means for counting a cumulative number of failed devices among said devices in said chamber at predetermined time intervals;

computing means for computing a cumulative failure rate of said devices in said chamber at said time intervals each time based on said cumulative number counted by said counting means and producing a feedback signal representative of an increment of the cumulative failure rate during each of said time intervals; and control means for comparing said increment of the cumulative failure rate represented by said feedback signal with a predetermined reference increment of cumulative failure rate and commanding said power and signal supplying means to terminate the power and signal supplying operation to thereby automatically terminate the burn-in procedure when said increment of the cumulative failure rate represented by said feedback signal becomes equal to said reference increment of cumulative failure rate or less.

2. A monitored burn-in system according to claim 1, wherein said predetermined time intervals are constant.

3. A monitored burn-in system according to claim 1, wherein said feedback signal is a digital signal.

4. A monitored burn-in system according to claim 1, wherein said monitoring means has the function of providing a failure signal to said counting means each time when any one of said devices in said chamber fails to function properly.

* * * * *